United States Patent

[11] 3,568,000

[72] Inventors Francois Regis D'Aboville
Versailles;
Jean-Francois Martre; Claude Cherdo,
Saint-Michel-sur-Orge, France

[21] Appl. No. 777,560
[22] Filed Nov. 21, 1968
[45] Patented Mar. 2, 1971
[73] Assignee Compagnie Generale D'Electricite
Paris, France
[32] Priority Nov. 22, 1967
[33] France
[31] 129,286

[54] MULTILAYER PRINTED CIRCUIT
2 Claims, 11 Drawing Figs.

[52] U.S. Cl. 317/101, 333/84
[51] Int. Cl. H05k 1/04
[50] Field of Search 317/101 (CM), 101 (CP); 174/35, 36, 685; 333/84 (M); 339/18 (C), 174 (M)

[56] References Cited

UNITED STATES PATENTS

| | | | |
|---|---|---|---|
| 3,081,416 | 3/1963 | Tuttle et al. | 317/101CM(UX) |
| 3,132,210 | 5/1964 | Adelaar | 339/18C(UX) |
| 3,218,584 | 11/1965 | Ayer | 317/101CP(UX) |
| 3,351,953 | 11/1967 | Sear | 174/68.5 |

*Primary Examiner*—David Smith, Jr.
*Attorney*—Sughrue, Rothwell, Mion, Zinn & Macpeak

ABSTRACT: Multilayer printed circuit for signals whose rise time is less than one nanosecond. The conductive layers are stacked in the following order starting at any of the outer faces: connecting layer, ground layer, supply layer, ground layer. Thus, connections may be made by means of fixed-impedance microstrip lines and supply by means of very low impedance strip lines (less than a fraction of 1 ohm).

MULTILAYER PRINTED CIRCUIT

BACKGROUND OF THE INVENTION

1. Field of the Invention

The present invention concerns multilayer printed electric circuits and more particularly those which are intended for the processing of briefly varying signals, of which the positive-going and negative-going edges may be of the order of 200 ps, for example.

2. Description of the Prior Art

It is known to superimpose a number of layers of printed circuits and to apply to one or both external faces of the assembly thus formed electronic elements in the form of discrete components such as transistors, diodes, resistors, capacitors or electronic circuits formed of such components. The connections of these electronic components or circuits to the various printed layers may with advantage be effected by means of metallized holes extending completely or partly through these layers, in accordance with a well-known technique.

It is also known to form an electric line adapted to conduct, notably, electric signals of very high frequency by completely or partly metallizing the two faces of an insulating plate. If the thickness and the nature of this plate are well-defined, the width of the two metallizations, which are assumed to extend in parallel relationship to one another, and at least partially opposite to one another on either side of the plate, the characteristic impedance of this connection is also well-defined. It is higher in proportion as the insulation is thicker and in proportion as the opposed portions of the metallizations are narrower.

SUMMARY OF THE INVENTION

The present invention makes it possible to obviate the disadvantages of the known multilayer printed circuits. It relates to a multilayer printed circuit for briefly varying signals, which consists of a stack of at least partially conductive layers and of alternate insulating plates. Some of these layers, here called connecting layers, consist of separate conductors which establish the connections between electronic elements provided on the printed circuit. Others of these layers effect the supply to these elements from a unidirectional-voltage source, while further of the said layers perform the function of an electrical ground. Electrical connections between layers are made through holes having conductive walls which extend through the said stack. The outer conductive layers are connecting layers whose conductors with ground layer each constitute a microstrip line. The circuit is composed of layers stacked in the following order, starting from either of the two outer connecting layers: ground layer, supply layer, ground layer, and ending with the other of the two outer connecting layers.

It will be seen that the arrangement according to the present invention makes it possible to produce supply lines in the form of strip lines, because they are disposed between two ground layers, while the connecting layers have the form of microstrip lines.

The relatively low impedance of the strip lines is thus utilized, because it is desirable to give a supply line a low impedance in order to avoid coupling between electronic elements through the supply circuit. Within the scope of the present invention, impedances of less than 1 ohm down to one-tenth of an ohm are readily obtained, while the impedance of the microstrip lines is of the order of 100 ohms.

In addition, the interposition of a ground layer between the supply layer and the connecting layer makes it possible to give the microstrip lines an absolutely constant impedance. The arrangement of the connecting layers on the outer faces of the multilayer circuit, such arrangement being known per se and used with the present invention, provides a means of ready access to the electronic elements. It is easy to give the various microstrip lines the same impedance, for which purpose it is sufficient for the conductors to have the same width and for the thickness of the insulating plate separating the connecting layer from the neighboring ground layer to be constant.

In order that two connections may not cross one another on one of the outermost faces, one of the connections is made on one of the outermost faces and the other connection is made on the other face of the multilayer printed circuit, there being metallized holes to permit of coupling the connection situated on one face to the electronic circuits situated on the other face.

In the case of a plurality of connections, some of them are likewise made on one of the faces and others on the other face, but some may remain which cannot be thus traced without crossing. Each of the remaining connections is then made partly on one of the faces and partly on the other face, their electrical continuity being ensured by metallized holes joining the corresponding portions applied to the two faces.

The connections through metallized holes may advantageously have, in relation to the microstrip lines, a negligible impedance mismatch for signals whose positive-going times $t_r$ are greater than the quotient of four times the length of the said connection, times, the speed of propagation $v$ of the signals in the insulation.

Another advantage resides in the fact that one or more of the connections between electronic circuits, which are printed on the outer faces of the multilayer circuit, may be readily modified. It is sufficient to replace an old connection by a new connection, of like impedance, consisting of a conductor or appropriate diameter applied to the same outer face of the printed circuit.

Finally, it is possible in accordance with the invention to form the outer insulating plates with apertures so that there may be disposed therein electronic circuits whose support is an insulating plate of the same nature and of the same thickness as the outer insulating plates of the multilayer printed circuit. The terminals of such an electronic circuit being supported by one of these faces, this face is so disposed as to face outwards and as to be situated in the plane of the outer face of the multilayer circuit. The coupling connections between the terminals of the said electronic circuit and the terminals of the multilayer circuit are then made in this plane, whereby it is possible to retain the same impedance throughout the length of the lines of the microstrip type formed by the connections.

The present invention will be more readily understood with reference to the accompanying FIGS., which illustrate non-limiting embodiments.

Figure 1A:
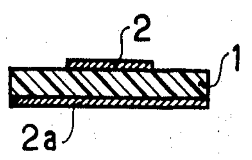
FIG. 1a PRIOR ART
FIG. 1*a* is a sectional view of a structure known in the prior art as a microstrip line.

A structure known in the prior art as a "microstrip" line is illustrated by way of example in FIG. 1*a*. In this FIG., the insulating plate is shown in section and is denoted by 1, while one of the metallizations is denoted by 2 and the other by 2*a*.

Figure 1B:
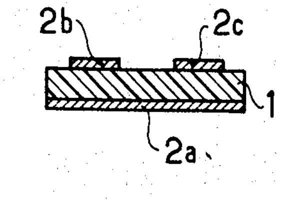
FIG. 1b PRIOR ART
FIG. 1*b* is a modification of the prior art structure shown in FIG. 1*a*.

When, as illustrated, the metallization 2a is much wider than the metallization 2 and extends beyond it on either side, the thickness of insulation being small in relation to said width, the impedance of the line thus formed no longer depends upon the width of the metallization 2a, but only upon that of the metallization 2. It is then conventional, as shown in FIG. 1*b*, to employ the wide metallization 2a simultaneously for a number of lines each defined by a narrower metallization such as 2b and 2c. The metallization 2a then performs the function of a common ground, one of the signals to be transmitted being applied between this ground and the metallization 2b and the other between this ground and the metallization 2c.

Figure 2A:
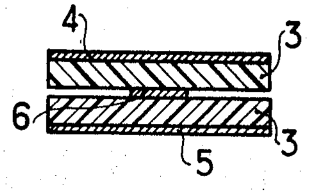
FIG. 2a PRIOR ART
FIG. 2*a* is a sectional view of a structure known in the prior art as a strip line.

It is also known to form a line capable of transmitting electric signals of very high frequency with the aid of two insulating plates such as 3,3 (see FIG. 2*a*), between which there is disposed a metallization 6 constituting an axial conductor, the two outer faces of conductors 4 and 5 of the assembly thus formed also being metallized. Such a structure is known as a "-strip line."

Figure 2B:
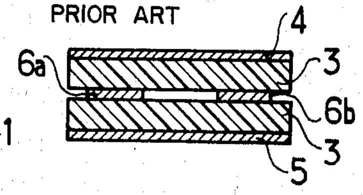
FIG. 2b PRIOR ART
FIG. 2*b* is a modification of the prior art structure shown in FIG. 2*a*.

If the nature and the thickness of the insulating plates are well-defined, as also the width of the metallizations, the impedance is also well-defined. It is higher in proportion as the insulating plates are thicker and in proportion as the axial conductor is narrower. With a given thickness of the insulating plates, the impedance of a strip line is lower than that of a microstrip line. Of course, it is possible, as in the case of microstrip lines, to employ outer conductors 4 and 5 as a common ground for a number of transmission lines each defined by a separate axial conductor. In FIG. 2*b*, two axial conductors 6a and 6b are shown. The conductors 4 and 5 are brought to the same potential and constitute a common ground, and one of the signals to be transmitted is applied between this common ground and the axial conductor 6a and the other between this common ground and the axial conductor 6b.

Figure 3:
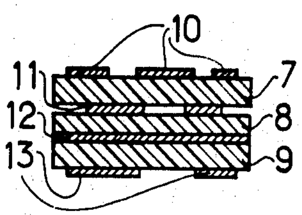
FIG. 3 PRIOR ART
FIG. 3 is a sectional view of a well-known type of multilayer circuit.

It is also known to employ multilayer circuits comprising one or more supply lines on which the signal-transmitting lines are superimposed. FIG. 3 diagrammatically illustrates a known multilayer circuit in which 7, 8 and 9 are insulating plates and 10, 11, 12, 13 are metallizations. The supply line consists of the metallizations 11 and 12 separated by the insulation 8, and the metallization 12 constitutes the electrical ground. The signals are transmitted by lines consisting of the metallizations 10 and 12 on the one hand and 12 and 13 on the other hand.

Such an arrangement has disadvantages, because, even if the width of the metallizations 10 is made absolutely constant, it is not possible to make the impedance of the microstrip transmission lines 10—12 constant by reason of the interposition of the supply lines. The corresponding impedance variations are troublesome in the transmission of brief signals.

Figure 4:
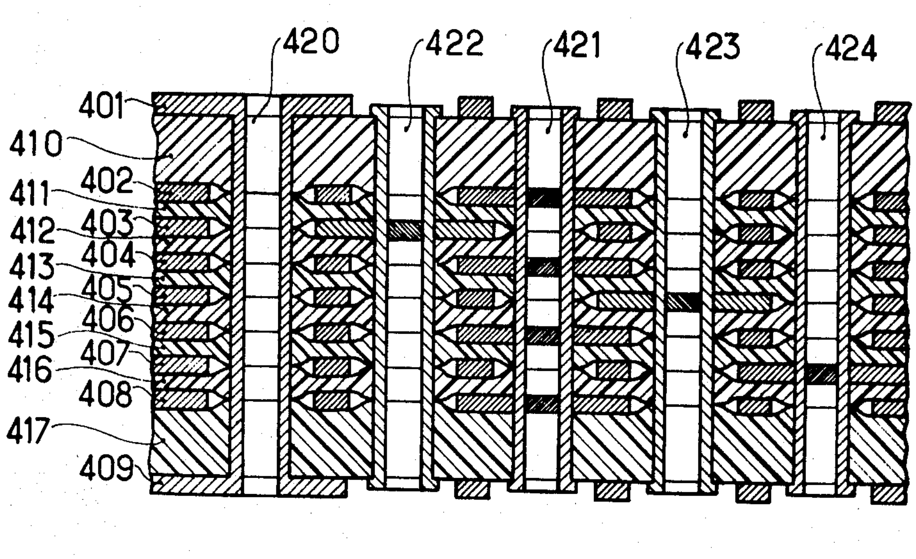
FIG. 4 is a section through a multilayer circuit according to the invention.

In FIG. 4, there are denoted by 401, 402, 403, 404, 405, 406, 407, 408, and 409 copper metallizations and by 410, 411, 412, 413, 414, 415, 416 and 417 insulating plates, for example of epoxy glass.

In this FIG., there are shown three lines of the strip-line type, which consist of the insulations and metallizations: 402, 411, 403, 412 and 404 in the case of the first; 404, 413, 405, 414 and 406 in the case of the second; and, 406, 415, 407, 416 and 408 in the case of the third. On each side of this assembly formed by the three above-designated strip lines are shown two lines of the microstrip type, which are formed by the metallizations and insulations; 401, 410 and 402 in the case of one; and, 408, 417 and 409 in the case of the other. By way of example, the insulating plates 410 and 417 have a thickness of 600 microns, the insulating plates 411 to 416 have a thickness of 60 microns and the metallizations 401 to 409 consisting of copper, for example, all have a thickness of 35 microns. The mechanical strength of the stack is thus principally ensured by the plates 410 and 417 because the thickness of the other insulating plates and the metallic film is too small to support the stack.

The impedance of each of these lines is made constant.

The technique of metallized holes makes it possible to connect the inner metallized layers of the multilayer printed circuit to the outer metallized layers, or to connect the metallizations of these layers to one another. The diameters of these holes are so chosen that the characteristic impedance of the lines which they constitute is as close as possible to that of the lines of the strip-line type and above all of the microstrip type which are connected by these holes.

A metallized hole 420 connects together the metallizations or connections 401 and 409. A metallized hole 421 connects to the outer layers the metallizations 402, 404, 406 and 408 which constitute the grounds within the multilayer printed circuit. Metallized holes 422, 423 and 424 connect the metallized layers 403, 405 and 407 respectively to the two faces of the multilayer printed circuit. These layers are connected through these metallized holes to one of the poles of a supply source, the other pole of which is connected through metallized holes such as 421 to the metallized layers 402, 404, 406 and 408.

Figure 5:
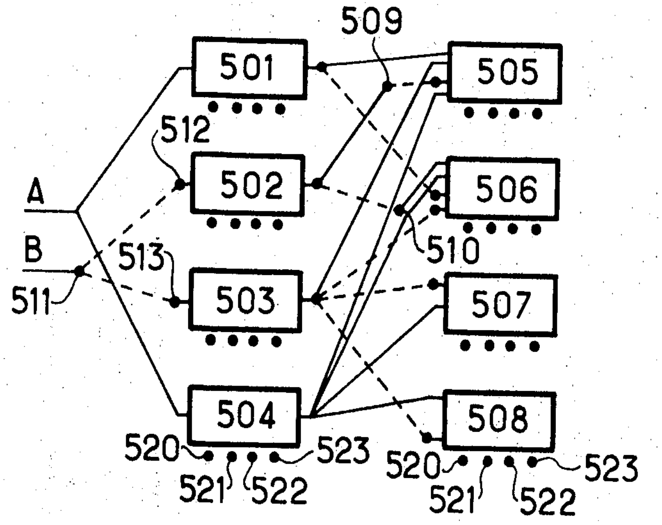
FIGS. 5 and 6 illustrate examples of wiring diagrams between the electronic circuits disposed on a common face.

FIG. 5 illustrates a part of a logic assembly utilizing logic circuit 501 through 508, disposed on one of the outer faces of a multilayer circuit according to the invention. The solid lines represent connections between the logic circuits, these connections being made by metallizations on the outer face supporting these logic circuits. The broken lines represent connections made by metallizations on the other outer face of the multilayer circuit.

Metallized holes such as 520, 521 and 522, represented by dots, are each connected respectively to one of the poles of a supply source, the other pole of which is connected to the ground of the circuit and brought to the surface through a metallized hole 523. Each logic circuit 501 to 508 is secured to the multilayer printed circuit by this series of four metallized holes, the logic circuits being connected to these holes and therefore to the electrical supply sources.

The logic circuits 501 to 504 receive logic signals from the lines A and B formed by metallizations. All these connections may not be made on a single face of the multilayer printed circuit, because they cross one another. Therefore, the connections of *A* to 501 and 504 are made on one face of the printed circuit and the connections of *B* to the logic circuits 502 and 503 on the other face, starting from the metallized hole 511 which gives access to the other face. The metallized holes 512 and 513 bring these connections to the face supporting the logic circuits 502 and 503, whereby it is possible to make the connections to these logic circuits, The connection between logic circuits 502 and 505 is partly effected on one face and partly on the other face of the multilayer circuit by means of the metallized hole 509. It will readily be seen that, on the face supporting the logic circuits, this connection would cross the connections of 503 to 505 and that on the opposite face it would cross the connection of 501 to 506. The solution adopted therefore makes it possible to resolve the problem of the crossing of connections. The connection between the logic circuits 502 and 506 is also made partly on one face and partly on the other face of the multilayer printed circuit.

Figure 6:
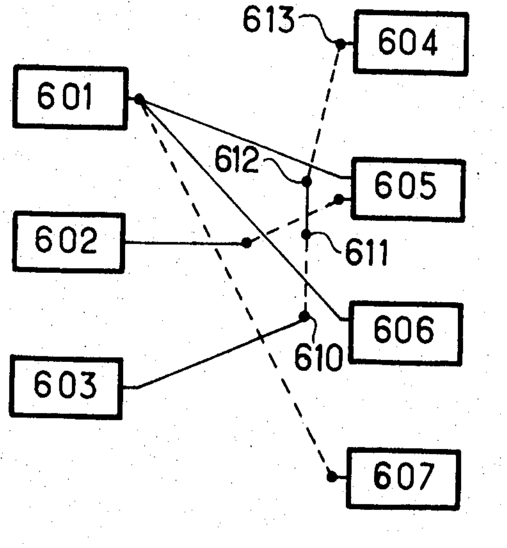

FIG. 6 illustrates a more complex case than FIG. 5. It will be seen therein that the connection of a circuit 603 to a circuit 604 comprises two sections 603 to 610, and 611 to 612 on an outer face of the multilayer circuit and two sections 610 to 611 and 612 to 613 on the other face, which are connected with the aid of metallized holes 610, 611, 612 and 613.

Figure 7A:
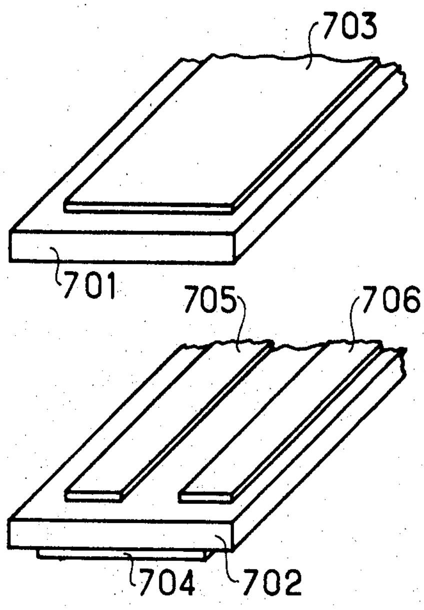
FIGS. 7*a* and 7*b* illustrate in perspective, by way of example, two types of a strip-line structure which may be employed in the multilayer printed circuit according to the invention.

FIG. 7*a* is an exploded view of a structure of the strip-line type. This structure is composed of two insulating plates 701 and 702, two outer metallizations 703 and 704 and, by way of example, two metallizations 705 and 706 on the upper face of the insulating plate 702. When the insulating plate 701 is applied to the insulating plate 702 to form the strip-line structure, the two metallizations 705 and 706 each constitute with the metallizations 703 and 704 a line which may be connected to a supply source.

Figure 7B:
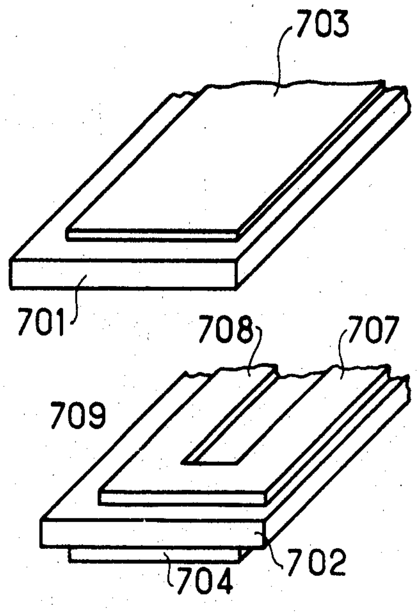

FIG. 7*b* is an exploded view of a structure of the strip-line type in which the elements denoted by the same numerals as in FIG. 7*a* perform the same function. By way of example, in FIG. 7*b*, there are shown two metallizations 707 and 708 connected together by a metallization 709. The common metallization 709 can thus be connected to a supply source, the metallizations such as 707 and 708 serving to connect this supply source through metallized holes to the supply terminals of various electronic circuits disposed on one or both outer faces of the multilayer circuit according to the invention.

Figure 8:
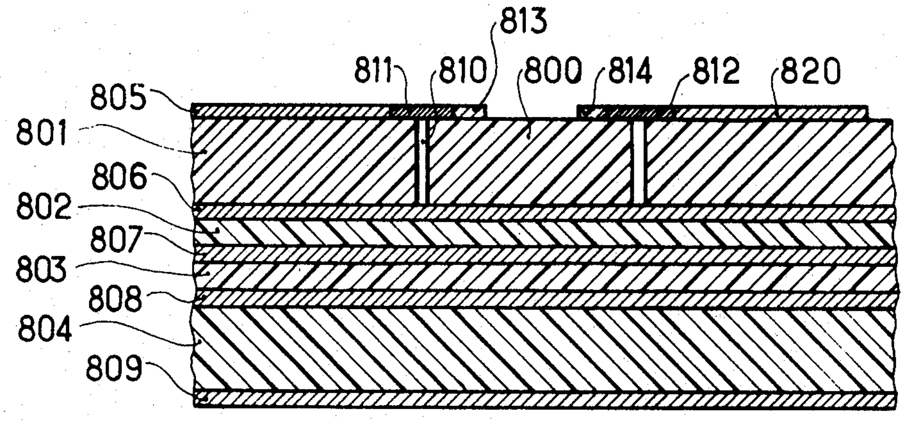
FIG. 8 illustrates by way of example a multilayer circuit according to the invention which is formed with an aperture in which an electronic circuit may be disposed.

FIG. 8 illustrates a multilayer printed circuit comprising a strip-line structure, formed of insulating plates 802 and 803 and metallizations 806, 807 and 808, a microstrip structure formed of 808, 804 and 809 and another microstrip structure formed of 805, 801 and 806, and 820, 801 and 806. The insulating plate 801, which has a thickness of 600 microns, for example, is formed with an aperture 810 to receive a support plate 800 of an electronic circuit, this plate also having a thickness of 600 microns and consisting of the same material as the plate 801. The metallizations 805 and 820 constitute logic connections, for example, which are connected to the terminals 813 and 814 of the electronic circuit supported by the plate 800, by connections 811 and 812. These connections 811 and 812 are in the same plane as the connections 805 and 820 and continue the lines formed by 805, 801, 806 and 820, 801, 806, so that there is no change of impedance when these lines are connected to the terminals 813, 814 of the electronic circuit supported by the plate 800.

We claim:

1. A multilayer printed circuit for briefly varying signals, comprising: a stack of at least partially conductive layers and alternate insulating plates, at least one of said layers consisting of separate conductors which establish the connections between electronic elements supported by the printed circuit, at least one other of said layers connecting a unidirectional voltage source to these elements, at least one other of said layers connected to an electric ground, means including conductive walls extending through holes in said stack to electrically connect the layers, said layers being stacked in the following order starting from either of the two outer connecting layers; ground layer, supply layer, ground layer, and ending with the other of the two outer connecting layers, wherein said connecting layers consist of several metallic strips which transmit electric impulses and a metallic film, said metallic strips and said metallic film being separated by an insulating plate much thicker than said metallic film to insure good mechanical strength, and said supply layer consists of a metallic strip separated from a metallic film by insulating plates of a thickness on the order of said metallic film so that the characteristic impedance of the strip-line supply layer thus formed is less than 1 ohm.

2. A multilayer printed circuit according to claim 1, wherein at least one of the two outermost insulating plates is formed with an aperture which is closed by a plate having the same dielectrical characteristics and the same thickness as said insulating plate, the closure plate having metallization in continuation with the microstrip lines on said outer conductive layer, having the same characteristic impedance as these lines, and being connected thereto.